(12) United States Patent
Du et al.

(10) Patent No.: US 12,106,816 B2
(45) Date of Patent: Oct. 1, 2024

(54) LATCH PERFORMANCE DETECTION METHOD, DEVICE AND ELECTRONIC DEVICE

(71) Applicant: ChangXin Memory Technologies, Inc., Hefei (CN)

(72) Inventors: Tao Du, Hefei (CN); Shao Li, Hefei (CN)

(73) Assignee: ChangXin Memory Technologies, Inc., Hefei (CN)

(*) Notice: Subject to any disclaimer, the term of this patent is extended or adjusted under 35 U.S.C. 154(b) by 0 days.

(21) Appl. No.: 17/790,472

(22) PCT Filed: May 9, 2022

(86) PCT No.: PCT/CN2022/091796
§ 371 (c)(1),
(2) Date: Jun. 30, 2022

(87) PCT Pub. No.: WO2023/206603
PCT Pub. Date: Nov. 2, 2023

(65) Prior Publication Data
US 2024/0170092 A1 May 23, 2024

(30) Foreign Application Priority Data
Apr. 29, 2022 (CN) .......................... 202210469009.1

(51) Int. Cl.
*G11C 29/56* (2006.01)
(52) U.S. Cl.
CPC .. *G11C 29/56016* (2013.01); *G11C 29/56004* (2013.01)
(58) Field of Classification Search
CPC ........ G11C 29/56016; G11C 29/56004; G11C 29/02; G11C 29/50; G11C 29/50008; G11C 29/56; G11C 11/401
(Continued)

(56) References Cited

U.S. PATENT DOCUMENTS 5,248,956 A * 9/1993 Himes .................... G06N 3/065
338/334
6,603,415 B1 8/2003 Somayajula
(Continued)

FOREIGN PATENT DOCUMENTS

| CN | 1702962 A | 11/2005 |
|---|---|---|
| CN | 107180619 A | 9/2017 |
| CN | 113051860 A | 6/2021 |

OTHER PUBLICATIONS

EP 22839977.0 Extended European Search Report mailed Feb. 1, 2024.
(Continued)

*Primary Examiner* — Fernando Hidalgo
(74) *Attorney, Agent, or Firm* — Kilpatrick Townsend & Stockton LLP

(57) ABSTRACT

The present disclosure provide latch performance detecting method and a device. The method includes: extracting circuit structure information of a latch, having a transmission gate and a latch unit, an output terminal of the transmission gate is coupled to the input terminal of the latch unit, and the input terminal is coupled to the output terminal of the drive unit corresponding to the latch; the resistance value of the equivalent resistor of the latch is determined based on the circuit structure information, The first terminal of the equivalent resistor is the output terminal of the driving unit, and the second terminal is the input terminal of the latching unit; based on the resistance value of the equivalent resistor, the latching performance is determined. The embodiments of the present disclosure can accurately detect whether the latch is in a metastable state, which helps to improve the performance of the circuit.

17 Claims, 9 Drawing Sheets

(58) Field of Classification Search
USPC .......................................................... 365/201
See application file for complete search history.

(56) References Cited

U.S. PATENT DOCUMENTS

| | | | |
|---|---|---|---|
| 9,166,570 B2 | 10/2015 | Lewis et al. | |
| 9,477,104 B2* | 10/2016 | Liu | G09G 3/3677 |
| 2008/0155484 A1* | 6/2008 | Agrawal | G06F 30/3312 |
| | | | 716/136 |
| 2021/0075407 A1* | 3/2021 | Cai | H03K 3/3562 |

OTHER PUBLICATIONS

Beer et al., "An on-chip metastability measurement circuit to characterize synchronization behavior in 65nm," Circuits and Systems, 2011 IEEE International Symposium on May 15, 2011, pp. 2593-2596, DOI: 10.1109/ISCAS.2011.5938135.

* cited by examiner

LATCH PERFORMANCE DETECTION METHOD, DEVICE AND ELECTRONIC DEVICE

CROSS REFERENCES TO RELATED APPLICATIONS

This application claims the benefit of priority to CN Patent Application 202210469009.1 filed on Apr. 29, 2022, entitled "Latch Performance Detection Method, Device and Electronic Device", the contents of which are incorporated herein by reference in its entirety.

TECHNICAL FIELD

Present disclosure relates to the field of semiconductor technology, and in particular, to a method, device, and electronic device for detecting latch performance.

BACKGROUND

Latches are memory cell circuits sensitive to pulse voltages that can change states under the specific input pulse voltage levels.

During the design and use of the latches, the larger the resistance value between the driving end and the latching terminal of the latch is, the weaker the driving capability will be, which will cause the latches to be in a metastable state.

When a latch is in a metastable state, it is impossible to determine whether the output state of the latch is "1" or "0". This unknown state makes the internal state of the circuit related to the latch unstable enough to prevent implementing a latching function, which affects the performance of the circuit

SUMMARY

Embodiments of the present disclosure provide a latch performance detection method, device, and electronic device, which can accurately detect whether the latch is in a metastable state, and help improve circuit performance.

In a first aspect, an embodiment of the present disclosure provides a latch performance detection method, including:
Extract the circuit structure information of the latch to be tested, the latch includes a transmission gate and a latch unit, the output terminal of the transmission gate is coupled to the input terminal of the latch unit, and the input terminal of the transmission gate coupled to the output terminal of the drive unit corresponding to the latch;
The value of the equivalent resistor of the latch is determined based on the circuit structure information. The first terminal of the equivalent resistor is the output terminal of the driving unit, and the second terminal of the equivalent resistor is the input terminal of the latch unit;
Based on the resistance value of the equivalent resistor, the latching performance of the latch is determined.
In a feasible implementation method, the resistance value of the equivalent resistor of the latch is determined based on the circuit structure information, including:
establishing an simulation circuit based on the circuit structure information, the simulation circuit including a parasitic semiconductor device between the output terminal of the driving unit and the input terminal of the latch unit;
testing the simulation circuit to determine the resistance value of the equivalent resistor.

establishing a simulation circuit based on the circuit structure information in a feasible implementation method, including:
receiving a first file, where the first file includes parasitic parameter information and connection information of the parasitic semiconductor device; and
establishing the simulation circuit based on the circuit structure information and the first file.
In a feasible implementation method, the simulation circuit includes the transmission gate.
In a feasible implementation method, the simulation circuit is tested to determine the resistance value of the equivalent resistor, including:
applying a working voltage at the output terminal of the driving unit, and measuring the working current at the input terminal of the latching unit to determine the value of the equivalent resistor.
In a feasible implementation method, determining the latching capability of the latch based on the resistance value of the equivalent resistor includes:
determining a resistance threshold corresponding to the drive unit;
judging whether the resistance value of the equivalent resistor is greater than the resistance threshold value, and if the resistance value of the equivalent resistor is greater than the resistance threshold value, it is determined that the latch is in a metastable state.
In a feasible implementation method, the determining the resistance threshold corresponding to the driving unit includes:
receiving a second file is, where the second file includes resistance thresholds corresponding to the drive units.
In a feasible implementation method, the driving unit includes an inverter, the inverter includes an NMOS transistor and a PMOS transistor, and an output terminal of the driving unit is a drain terminal that is commonly connected to the NMOS transistor and the PMOS transistor.
In a feasible implementation method, before extracting the circuit structure information of the latches to be tested, the method further includes:
receiving a third file, where the third file includes circuit structure information of a plurality of latches to be tested;
The extracting circuit structure information of the latches to be tested includes:
extracting the circuit structure information of all the latches to be tested in the third file.
In a second aspect, an embodiment of the present disclosure provides a latch performance detection device, including:
an extraction module for extracting circuit structure information of a latch to be tested, the latch includes a transmission gate and a latch unit, the output terminal of the transmission gate is coupled to the input terminal of the latch unit, the input terminal of the transmission gate is coupled to the output terminal of the drive unit corresponding to the latch;
a test module, configured to determine the resistance value of the equivalent resistor of the latch based on the circuit structure information, the first terminal of the equivalent resistor is the output terminal of the driving unit, the first terminal of the equivalent resistor is the output terminal of the driving unit, and the first terminal of the equivalent resistor and the two ends are the input terminals of the latch unit; and a judging module, configured to determine the latching performance of the latch based on the resistance value of the equivalent resistor.

In a feasible implementation method, the test module is specifically used for:
establishing a simulation circuit based on the circuit structure information, the simulation circuit including a parasitic semiconductor device between the output terminal of the driving unit and the input terminal of the latch unit; and
the simulation circuit is tested to determine the resistance value of the equivalent resistor.

In a feasible implementation method, the test module is specifically used for:
receiving a first file, where the first file includes parasitic parameter information and connection information of the parasitic semiconductor device;
establishing a simulation circuit based on the circuit structure information and the first file.

In a feasible implementation method, the transmission gate is included in the simulation circuit.

In a feasible implementation method, the test module is specifically used for:
applying a working voltage at the output terminal of the driving unit, and working current is measured at the input terminal of the latching unit to determine the resistance value of the equivalent resistor.

In a feasible implementation method, the judging module is specifically used for:
determining a resistance threshold corresponding to the drive unit;
judging whether the resistance value of the equivalent resistor is greater than the resistance threshold value, if the resistance value of the equivalent resistor is greater than the resistance threshold value, it is determined that the latch is in a metastable state.

In a feasible implementation method, the judging module is specifically used for:
receiving a second file, where the second file includes resistance thresholds corresponding to the drive units.

In a feasible implementation method, a driving unit includes an inverter, the inverter includes an NMOS transistor and a PMOS transistor, and an output terminal of the driving unit is a drain terminal that is commonly connected to the NMOS transistor and the PMOS transistor.

In a feasible implementation method, the extraction module is further used for:
receiving a third file, where the third file includes circuit structure information of a plurality of latches to be tested, and
extracting the circuit structure information of all the latches to be tested in the third file.

In a third aspect, embodiments of the present disclosure provide an electronic device, including: at least one processor and a memory device;
the memory device stores computer-executable instructions;
The at least one processor executes the computer-executable instructions stored in the memory device, so that the at least one processor executes the latch performance detection method provided by the first aspect.

The latch performance detection method, device, and electronic device provided by the embodiments of the present disclosure include: by extracting circuit structure information of the latch to be tested, determine the resistance value of the equivalent resistor of the latch, because the resistance value of the equivalent resistor can accurately represent the resistance value between the drive terminal and the latch terminal of the latch. Therefore, based on the resistance value of the above equivalent resistor, it can be accurately judged whether the latch to be tested is in a metastable state, thereby improve circuit performance.

DETAILED DESCRIPTION OF THE PREFERRED EMBODIMENTS

Figure 1:
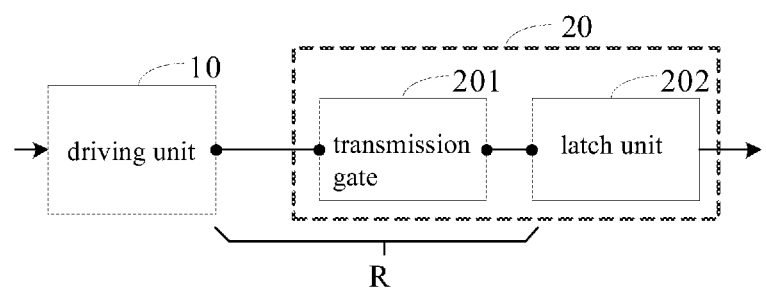
FIG. 1 is a schematic block diagram of a latch performance detection system provided in an embodiment of the present disclosure.

In order to make the purposes, technical solutions and advantages of the embodiments of the present disclosure clearer, the technical solutions in the embodiments of the present disclosure will be clearly and completely described below with reference to the accompanying drawings in the embodiments of the present disclosure. Obviously, the described embodiments These are some, but not all, embodiments of the present disclosure. Based on the embodiments in the present disclosure, all other embodiments obtained by those of ordinary skill in the art without creative efforts shall fall within the protection scope of the present disclosure. Furthermore, although the disclosures in this disclosure have been presented in terms of illustrative example or instances, it should be understood that various aspects of this disclosure may also constitute a complete embodiment in isolation.

It should be noted that the brief description of terms in the present disclosure is only to facilitate the understanding of the embodiments described below, rather than intended to limit the embodiments of the present disclosure. Unless otherwise specified, these terms are to be understood according to their ordinary and ordinary meanings.

The terms "first", "second" and the like in the description and claims of the present disclosure and the above drawings are used to distinguish similar or similar objects or entities, and are not necessarily meant to limit a specific order or sequence. unless otherwise noted. It is to be understood that the terms so used are interchangeable under appropriate circumstances, eg, can be implemented in an order other than those presented in the illustrations or descriptions of embodiments in accordance with the present disclosure.

Furthermore, the terms "comprising" and "having" and any variations thereof, are intended to cover but not exclusively include, for example, a product or device incorporating a series of components is not necessarily limited to those explicitly listed, but may include No other components are expressly listed or inherent to these products or devices.

The term "module" used in the embodiments of the present disclosure refers to any known or later developed hardware, software, firmware, artificial intelligence, fuzzy logic, or combination of hardware or/and software codes capable of performing the functions associated with the element.

The embodiments of the present disclosure relate to the fast detection of the latch performance, which can quickly detect whether the latch is in a metastable state.

Exemplarily, the embodiments of the present disclosure can be applied to the design of dynamic random access memory (Dynamic Random Access Memory, DRAM for short), but are not limited to this scope, and the present disclosure can be used in the design and use of the latch module.

The latch performance detection method provided by the embodiment detects the latch module.

Among them, the latch is a memory circuit sensitive to the pulse level, which can change the state under the action of a specific input pulse voltage level. Latching is to temporarily store the signal to maintain a certain voltage level state. In the digital circuit, binary digital signals "0" and "1" can be recorded.

The functions of latches generally include buffering, completing the asynchronous problem of high-speed controllers and slow peripherals, solving the problem of driving, and solving the problem that an input/output port can output as well as input.

During the design and use of the latch, the larger the resistance value between the driving end and the latching terminal of the latch, the weaker the driving capability, which will cause the latch to be in a metastable state.

Among them, when the latch is in a metastable state, it is impossible to determine whether the output state of the latch is "1" or "0". This unknown state makes the internal state of the circuit related to the latch not stable enough to prevent A latch function is implemented, which affects the performance of the circuit.

Faced with the above technical problems, the embodiments of the present disclosure provide a latch performance detection method, which determines the resistance value of the equivalent resistor of the latch by extracting the circuit structure information of the latch to be tested. The resistance value of the resistor can accurately represent the resistance value between the drive terminal and the latch terminal of the latch. Therefore, according to the resistance value of the above equivalent resistor, it can be accurately judged whether the latch to be tested is in a metastable state, Thereby improving the performance of the circuit.

Referring to FIG. 1, FIG. 1 is a schematic block diagram of a latch performance detection system provided in an embodiment of the present disclosure.

In some embodiments of the present disclosure, the above latch performance detection system includes a driving unit 10 and a latch to be tested 20. The latch 20 to be tested includes a transmission gate 201 and a latch unit 202, the output terminal of the transmission gate 201 is coupled to the input terminal of the latch unit 202, and the input terminal of the transmission gate 201 is coupled to the output terminal of the drive unit 10.

In some embodiments of the present disclosure, the above-mentioned coupling methods include direct connection, indirect connection, telecommunication connection, and signal communication connection, etc., which are not limited in the embodiments of the present disclosure.

In some embodiments of the present disclosure, the above-mentioned driving unit 10 includes a Complementary Metal Oxide Semiconductor (CMOS for short) inverter, which can make the output obtain a logic value opposite to that of the input.

In some embodiments of the present disclosure, the transmission gate 201 may adopt a transmission gate structure. Among them, the transmission gate is a controllable switch circuit that can transmit both digital signals and analog signals.

Exemplarily, the above-mentioned transmission gate 201 may include an N-type metal-oxide-semiconductor (N-Metal-Oxide-Semiconductor, NMOS for short) transistor and a PMOS transistor (positive channel Metal Oxide Semiconductor). It has very low on-resistance (hundreds of ohms) and high off-resistance (greater than $10^9$ ohms).

Among them, NMOS is turned on at high voltage, and PMOS is turned on at low voltage. That is, when the gate is at a low voltage, the NMOS is turned off and the PMOS is turned on; when the gate is at a high voltage, the NMOS is turned on and the PMOS is turned off.

Figure 2:
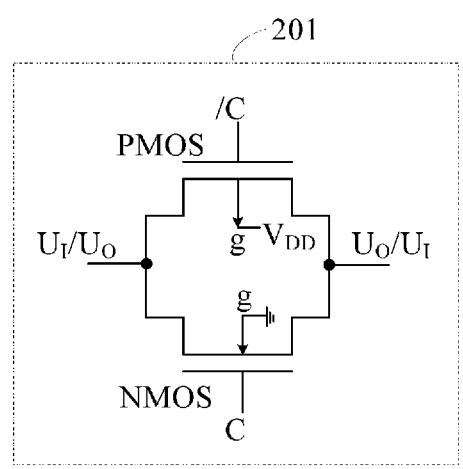
FIG. 2 is a schematic diagram of a transmission gate circuit according to an embodiment of the present disclosure.

For a better understanding of the embodiments of the present disclosure, refer to FIG. 2, which is a schematic diagram of a transmission gate circuit according to an embodiment of the present disclosure.

In FIG. 2, C and/C are complementary control signals, the source and drain of the PMOS tube and the NMOS tube are connected to each other, and the structure is symmetrical, so the input (UI) output (UO) can be used interchangeably.

Among them, when C=1, /C=0, and the input UI changes from 0-VDD, at least one of the PMOS tube and the NMOS tube is turned on, the gate g of the PMOS is a low voltage, and the gate g of the NMOS is a high voltage, the input and output are low resistance.

When C=0, /C=1, the gate g of the PMOS is a low voltage, the gate g of the NMOS is a high voltage, the PMOS tube and the NMOS tube are both non-conductive, and the input and output are in a high-impedance state.

That is, when C=1, /C=0, the transmission gate is turned on, UI=UO; when C=0, /C=1, the transmission gate is not turned on, and the signal cannot be transmitted, where 0 refers to low Voltage or ground, 1 refers to high voltage or supply voltage.

It should be noted that the transmission gate structure shown in FIG. 2 is only exemplary, and in some other embodiments of the present disclosure, transmission gates of other structural types may also be used, which are not limited in the embodiments of the present disclosure.

In some embodiments of the present disclosure, the above-mentioned latch unit 202 is generally composed of two inverters.

Figure 3:
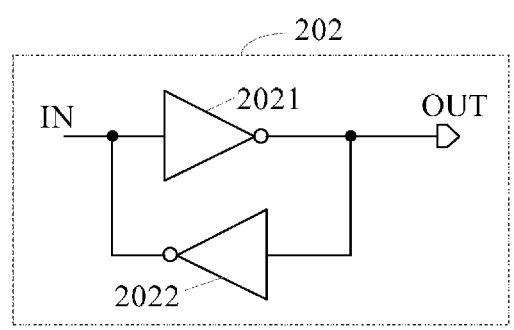
FIG. 3 is a schematic diagram of a latch unit according to an embodiment of the present disclosure.

For a better understanding of the embodiment of the present disclosure, refer to FIG. 3, which is a schematic diagram of a latch unit according to an embodiment of the present disclosure.

In FIG. 3, the above-mentioned latch unit 202 includes a first inverter 2021 and a second inverter 2022; wherein, the input terminal of the first inverter 2021 is connected to the input signal IN, and the output terminal the second inverter 2022 is connected to the input terminal of the first inverter 2021; and the output terminal of the first inverter 2021 is used as the output end OUT of the latch unit 202.

In some embodiments of the present disclosure, the input terminal of the first inverter 2021 serves as the input terminal of the latch unit 202 and is connected to the input signal IN, wherein when the input signal is at a low voltage level, the first inverter 2021 inverts to a high voltage level, and transmit the electrical signal to the second inverter 2022; the second inverter 2022 inverts the electrical signal back to the original low voltage level. When the input signal is a high voltage level, the first inverter 2021 inverts the high voltage level to a low voltage level, and transmits the electrical signal to the second inverter 2022, which inverts the electrical signal to the original high voltage level.

Through the output terminal of the first inverter 2021, that is, the output terminal OUT of the latch unit 202, the shift register of high and low voltage levels in timing is realized.

In some embodiments of the present disclosure, the resistance between the output terminal of the driving unit and the input terminal of the latch unit is an equivalent resistor R.

Figure 4:
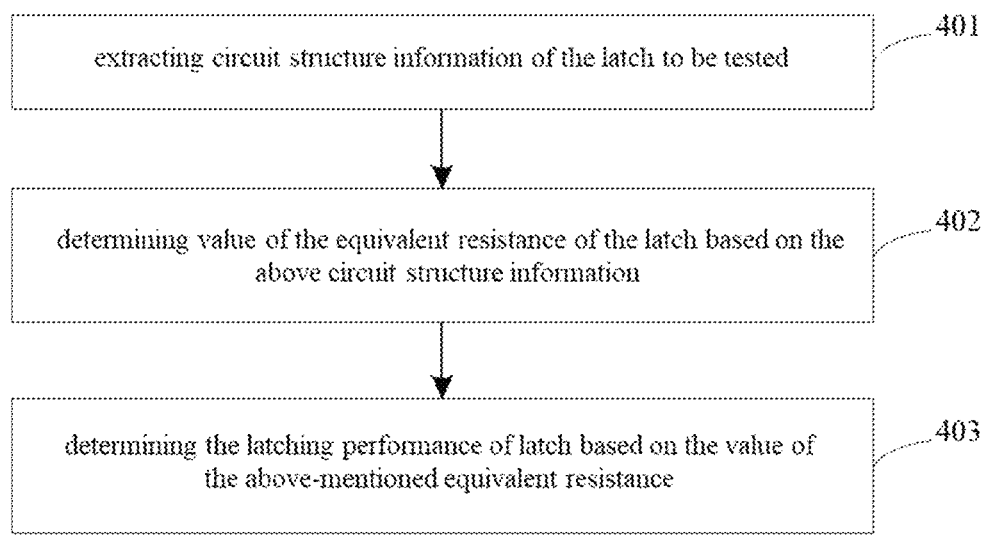
FIG. 4 is a first step flow diagram of a latch performance detection method according to an embodiment of the present disclosure.

Referring to FIG. 4, FIG. 4 is a first step flow diagram of a latch performance detection method according to an embodiment of the present disclosure. In some embodiments, the above-mentioned method for detecting a latch performance includes:

S401: extracting circuit structure information of the latch to be tested.

In some embodiments of the present disclosure, where the circuit structure information of latch to be tested in the circuit is located can be extracted, including latch connection information, connection signals, and the like.

S402: determining the value of the equivalent resistor of the latch based on the above circuit structure information.

In some embodiments of the present disclosure, after the circuit structure information of the latch to be tested is extracted, a parasitic module can be matched based on the circuit structure information, a simulation circuit can be established, and then the resistance of the equivalent resistor can be obtained by measuring the above-mentioned simulation circuit based on the simulation circuit. value.

It can be understood that the establishment and measurement of the above-mentioned simulation circuit are implemented through the netlist and simulation software, and no additional physical circuit needs to be built.

The resistance value of the above-mentioned equivalent resistor includes the parasitic resistance of the signal line connecting the output terminal of the driving unit to the input terminal of the latch unit and the equivalent resistor of the above-mentioned transmission gate.

S403: determining the latching performance of the above-mentioned latch based on the value of the above-mentioned equivalent resistor.

The greater the resistance value between the driving terminal and the latching terminal is, the more unstable the latch will be. Therefore, in some embodiments of the present disclosure, the latch performance of the above-mentioned latch can be determined based on the resistance value of the above-mentioned equivalent resistor.

Exemplarily, when the resistance of the equivalent resistor is greater than a preset threshold, it can be determined that the latch is in a metastable state; when the resistance of the equivalent resistor is less than or equal to the threshold, it can be determined that the latch device is in a stable state.

The latch performance detection method provided by the embodiment of the present disclosure determines the resistance value of the equivalent resistor of the latch by extracting the circuit structure information of the latch to be tested, because the resistance value of the equivalent resistor can accurately represent the resistance value between the drive terminal and the latch terminal of the latch, therefore, based on the resistance value of the above-mentioned equivalent resistor, it can be accurately judged whether the latch to be tested is in a metastable state, thereby improving the performance of the circuit.

Figure 5:
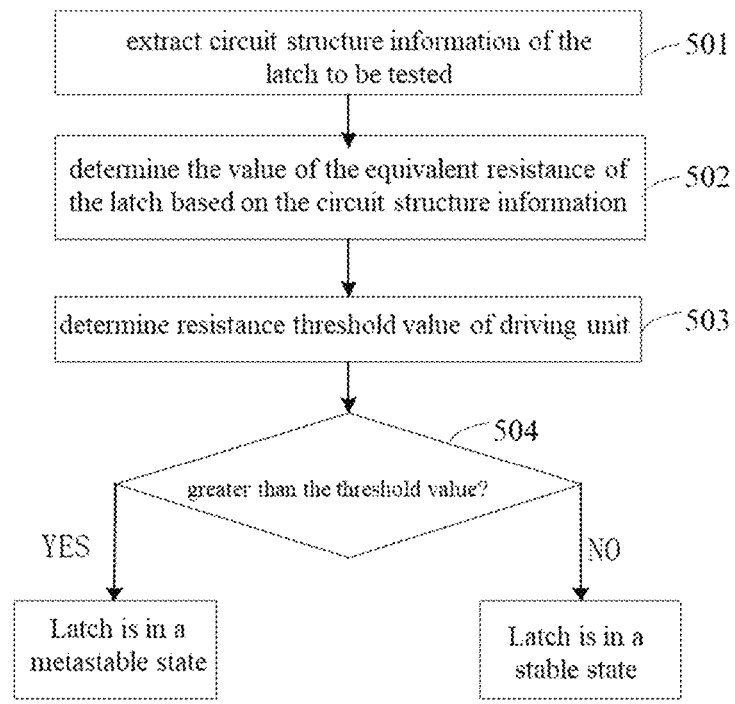
FIG. 5 is a second step flowchart of a method for detecting performance of a latch according to an embodiment of the present disclosure.

Based on the content described in the foregoing embodiments, referring to FIG. 5. FIG. 5 is a second step flowchart of a method for detecting performance of a latch according to an embodiment of the present disclosure. In some embodiments, the above latch performance detection method include:

S501, extract circuit structure information of the latch to be tested.

In some embodiments of the present disclosure, circuit structure information of all latch-related circuit structures in the circuit where the latch to be tested is located can be extracted, including latch connection information, connection signals, and the like.

S502: determine the value of the equivalent resistor of the latch according to the above circuit structure information.

In some embodiments of the present disclosure, a simulation circuit may be established based on the above circuit structure information. Wherein, the simulation circuit includes a parasitic semiconductor device between the output terminal of the driving unit and the input terminal of the latch unit.

In some embodiments of the present disclosure, the above-mentioned transmission gate is included in the above-mentioned simulation circuit.

In a feasible implementation method, the method further includes: receiving a first file, where the first file includes parasitic parameter information and connection information of the parasitic semiconductor device, for example, the resistance value and port information of the parasitic resistance of the signal line, and the parasitic capacitance capacitor value and port information, etc.

In a feasible implementation method, the above-mentioned simulation circuit may be established based on the above-mentioned circuit structure information and the above-mentioned first file.

Figure 6:
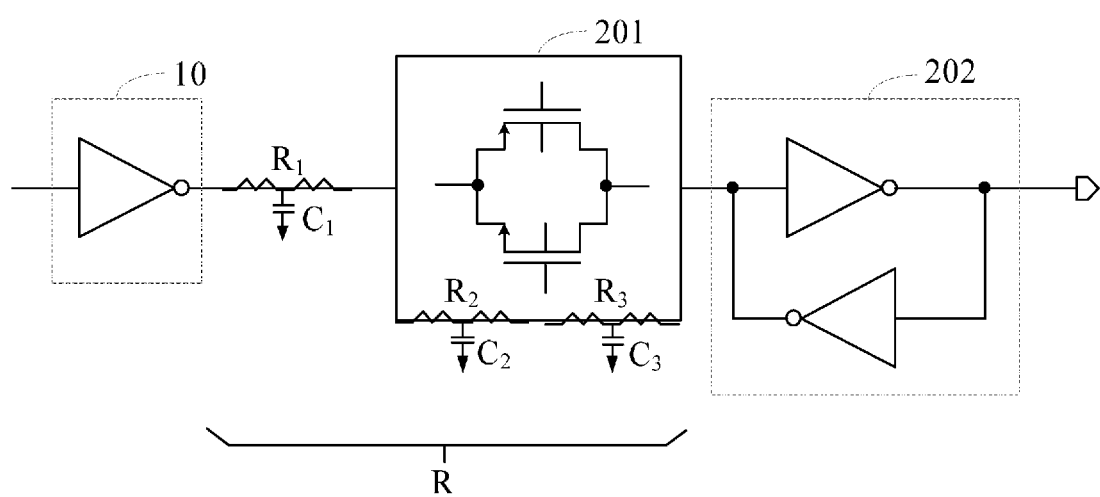
FIG. 6 is a schematic diagram of a simulation circuit according to an embodiment of the present disclosure.

For a better understanding of the embodiments of the present disclosure, refer to FIG. 6, which is a schematic diagram of a simulation circuit according to an embodiment of the present disclosure.

In FIG. 6, the above-mentioned simulation circuit includes a drive unit 10, a transmission gate 201 and a latch unit 202. The output terminal of the transmission gate 201 is coupled to the input terminal of the latch unit 202, and the input terminal of the transmission gate 201 is connected to the output terminal of the drive unit 10.

The above-mentioned simulation circuit includes parasitic semiconductor devices, such as R1, C1, R2, C2, R3, C3, etc., between the output terminal of the driving unit 10 and the input terminal of the latch unit 202.

In addition, the above-mentioned simulation circuit further includes the above-mentioned transmission gate.

In some embodiments of the present disclosure, after the above simulation circuit is established, the simulation circuit is tested to determine the resistance value of the equivalent resistor.

In a feasible implementation method, the operating voltage V can be applied to the output terminal of the above-mentioned driving unit, the operating current I can be measured at the input terminal of the above-mentioned latching unit, and then according to the voltage V and the measured operating current I, calculate the resistance value R of the above-mentioned equivalent resistor. That is: R=V/I.

It can be understood that the resistance value R of the above-mentioned equivalent resistor is the sum of the equivalent resistors of the above-mentioned parasitic semiconductor devices R1, R2, R3 and the above-mentioned transmission gate.

S503: determine the resistance threshold value corresponding to the above-mentioned driving unit.

It can be understood that, since different driving units have different driving capabilities, the resistance thresholds corresponding to different driving units are also different.

Exemplarily, Table 1 illustrates resistance thresholds corresponding to different driving units.

TABLE 1 resistance thresholds corresponding to different drive units

| No. | Drive unit | Resistance threshold (Ω) |
|---|---|---|
| 01 | CDINVF1 | 100 |
| 02 | CDINVF2 | 200 |
| 03 | CDINVF4 | 300 |

In some embodiments of the present disclosure, before the performance detection of the latch, a second file may be received in advance, where the second file includes the resistance threshold corresponding to the above-mentioned driving unit.

S504: determine whether the resistance value of the above-mentioned equivalent resistor is greater than the above-mentioned resistance threshold value.

In some embodiments of the present disclosure, after detecting the resistance value of the above-mentioned equivalent resistor, it is determined whether the resistance value is greater than the above-mentioned resistance threshold value. If the resistance value is greater than the resistance threshold, it is determined that the latch is in a metastable state; otherwise, it can be determined that the latch is in a stable state.

In the latch performance detection method provided by the embodiments of the present disclosure, a simulation circuit is established by extracting circuit structure information of the latch to be tested, and then the resistance value of the equivalent resistor can be determined by testing the simulation circuit. Since the resistance value of the equivalent resistor can accurately represent the resistance value between the driving terminal and the latch terminal of the latch, based on the resistance value of the equivalent resistor, it can be accurately judged whether the latch to be tested is in metastable state, thereby improving the performance of the circuit.

Based on the content described in the above embodiments, in some embodiments of the present disclosure, the above-mentioned driving unit 10 includes an inverter, and the inverter includes an NMOS transistor and a PMOS transistor, and the output ends of the above-mentioned driving unit 10 are NMOS transistors and PMOS transistors Commonly connected drain port.

Among them, the NMOS tube is an N-channel enhancement mode MOS tube, and a P-type substrate is used. The source (S) and gate (G) loops need a forward voltage to turn on the output loop; in addition, the substrate needs to be turned on. Connect to the source or to the lowest potential of the system.

The PMOS tube is a P-channel enhancement type MOS tube, which uses an N-type substrate.

The source (S) and gate (G) loops need a negative voltage before the output loop can be turned on; in addition, the substrate needs to be connected to the source pole or connected to the highest potential of the system.

Figure 7:
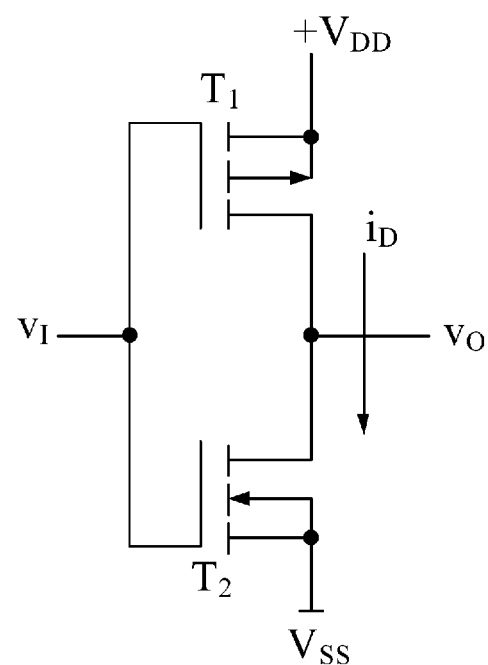
FIG. 7 is a schematic structural diagram of the kind of driving unit 10 according to the embodiment.

For a better understanding of the embodiment of the present disclosure, refer to FIG. 7, which is a schematic structural diagram of a driving unit 10 provided in the embodiment of the present disclosure.

In FIG. 7, T1 is a P-channel enhancement type MOS transistor, and T2 is an N-channel enhancement type MOS transistor.

In some embodiments of the present disclosure:

When V1 is low, T1 is turned on, T2 is turned off, and the output is high; when V1 is high, T2 is turned on, and T1 is turned off. The output voltage is low.

Among them, no matter whether it is a high voltage level or a low voltage level in a static state, there is always one between T1 and T2 that is cut off, and the cut-off internal resistance is very high, and the current flowing through is extremely small, so the static power consumption of the CMOS inverter is very low.

It can be understood that the size of the parasitic resistance and capacitance is related to the frequency of the connection signal, so for the register, the parasitic resistance and capacitance corresponding to different connection signals will be different, and the drive units corresponding to different connection signals will also have different.

Based on the contents described in the above embodiments, in some embodiments of the present disclosure, the latching performance of multiple latches in the circuit can be detected in batches.

In a feasible implementation method, the above-mentioned latch performance detection method includes:

Step 1: receive a third file, where the third file includes circuit structure information of a plurality of latches to be tested.

In some embodiments, the above-mentioned third file may include circuit structure information of all latches in the circuit.

Step 2: extract circuit structure information of the latch to be tested.

In some embodiments, the circuit structure information of all the latches to be tested in the third file may be extracted one by one or in batches.

Step 3: based on the circuit structure information of each of the above-mentioned latches to be tested, establish simulation circuits corresponding to each of the latches to be tested one by one or in batches.

In some embodiments, after the circuit structure information of each latch to be tested is extracted, parasitic modules can be matched respectively based on the circuit structure information of each latch to be tested, and simulations corresponding to each of the latches to be tested can be established in batches circuit, and then based on each simulation circuit, the resistance value of the equivalent resistor corresponding to each latch to be tested is obtained by measurement.

Wherein, the above-mentioned simulation circuit includes a parasitic semiconductor device between the output terminal of the drive unit corresponding to the latch to be tested and the input terminal of the latch unit.

In addition, the above simulation circuit also includes a transmission gate corresponding to the latch to be tested.

It can be understood that the establishment and measurement of the above-mentioned simulation circuits are implemented through the netlist and simulation software, and there is no need to build additional physical circuits.

The resistance value of the equivalent resistor corresponding to each latch to be tested includes the parasitic resistance of the signal line connecting the output terminal of the drive unit of each latch to be tested to the input terminal of the latch unit and the above-mentioned transmission gate equivalent resistor.

In a feasible implementation method, the method further includes: receiving a first file, where the first file includes parasitic parameter information and connection information of the parasitic semiconductor device, for example, the resistance value and port information of the parasitic resistance, and the capacitance value of the parasitic capacitance. and port information, etc.

In a feasible implementation method, a simulation circuit of each latch to be tested can be established respectively based on the circuit structure information of each latch to be tested and the above-mentioned first file.

In a feasible implementation method, after the simulation circuits of the latches to be tested are established, the simulation circuits of the latches to be tested are tested one by one or in batches, and the simulation circuits of the latches to be tested are determined. The resistance value of the equivalent resistor in the simulated circuit.

In a feasible implementation method, the working voltage V can be applied to the output terminal of the driving unit of each latch to be tested, the working current I can be measured at the input terminal of the latch unit, and then based on the voltage V and the measured working voltage V Current I, respectively calculate the resistance value R of the equivalent resistor corresponding to each latch to be tested. That is: R=V/I.

Step 3: determine the resistance thresholds corresponding to the driving units corresponding to each of the above-mentioned latches to be tested.

It can be understood that the same latch may correspond to different drive units. Since different drive units have different drive capabilities, and the resistance thresholds corresponding to different drive units will be different, the same latch uses different drive units. unit, the latching performance may vary.

In some embodiments of the present disclosure, before the performance detection of the latch, a second file may be received in advance, where the second file includes the resistance thresholds corresponding to the above-mentioned respective driving units.

Step 4: respectively judge the latching performance of each latch to be tested.

Since the greater the resistance value between the driving end and the latching end, the more unstable the latch is. Therefore, in some embodiments of the present disclosure, the resistance of the equivalent resistor in the simulation circuit corresponding to each of the above-mentioned latches to be tested can be determined based on the resistance value of the equivalent resistor, to determine the latching performance of each of the above-mentioned latches to be tested.

In some embodiments of the present disclosure, when the resistance value of the equivalent resistor in the simulation circuit corresponding to a certain latch to be tested is greater than the resistance threshold value corresponding to the driving unit, it can be determined that the latch to be tested is in a metastable state. When the resistance value of the equivalent resistor in the simulation circuit corresponding to a latch to be tested is less than or equal to the resistance threshold value corresponding to the driving unit, it can be determined that the latch to be tested is in a stable state.

In some embodiments of the present disclosure, batch measurement results may be recorded, and latches in a metastable state may be reported to designers, so that designers can improve the latches.

Exemplarily, refer to Table 2, which is a result table of latch performance detection when batch measurement is used.

TABLE 2

| Latch Performance Test Results from Batch Measurement | | | | | |
|---|---|---|---|---|---|
| Signal Name | Latch Hierarchical Information | Resistance of Equivalent resistor | Drive Unit | Resistance Threshold ($\Omega$) | Detection Results |
| sigNameA | XlatchA | 115 | CDINVF1 | 100 | Metastable |
| sigNameC | XlatchA | 185 | CDINVF2 | 200 | Stable |

The latch performance detection method provided by the embodiments of the present disclosure can detect whether multiple latches in a circuit are in a metastable state in batches, thereby effectively improving the efficiency of latch performance detection.

Figure 8:
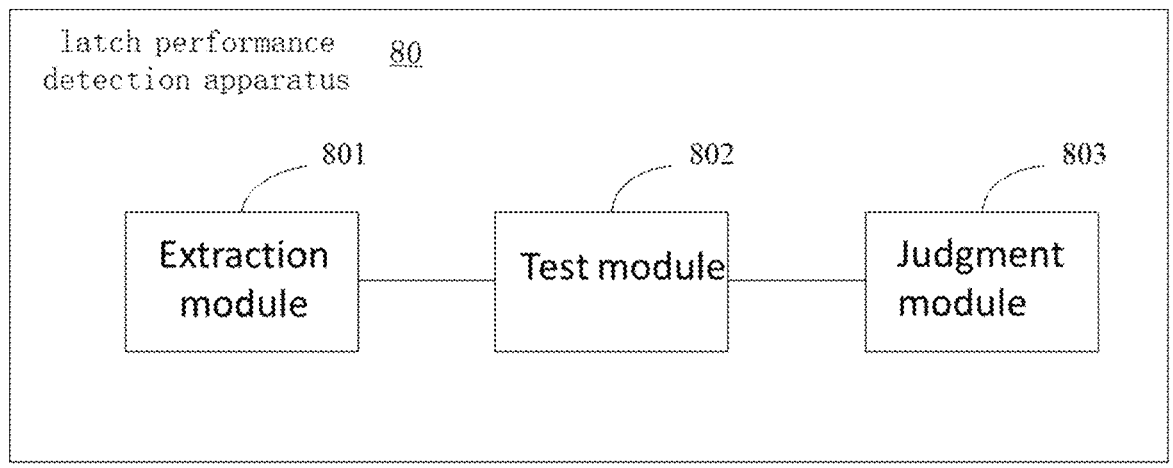
FIG. 8 is a schematic block diagram of a program module of a latch performance detection device according to an embodiment of the present disclosure.

Based on the content described in the foregoing embodiments, an embodiment of the present disclosure further provides a latch performance detection apparatus. Referring to FIG. 8, FIG. 8 is a schematic block diagram of a program module of a latch performance detection device based on an embodiment of the present disclosure. The latch performance detection apparatus 80 includes:

an extraction module 801, used to extract circuit structure information of the latch to be tested, the latch includes a transmission gate and a latch unit, the output terminal of the transmission gate is coupled to the input terminal of the latch unit, so the input terminal of the transmission gate is coupled to the output terminal of the driving unit corresponding to the latch;

a test module 802, configured to determine the resistance value of the equivalent resistor of the latch based on the circuit structure information, the first terminal of the equivalent resistor is the output terminal of the driving unit, the equivalent resistor is The second terminal is the input terminal of the latch unit; and a judgment module 803, configured to determine the latching performance of the latch based on the resistance value of the equivalent resistor.

The latch performance detection device provided by the embodiment of the present disclosure determines the resistance value of the equivalent resistor of the latch by extracting the circuit structure information of the latch to be tested, because the resistance value of the equivalent resistor can accurately represent the resistance value between the drive terminal and the latch terminal of the latch, therefore, based on the resistance value of the above-mentioned equivalent resistor, it can be accurately judged whether the latch to be tested is in a metastable state, thereby improving the performance of the circuit.

In some embodiments, the test module 802 is specifically used to:

establishing an simulation circuit based on the circuit structure information, the simulation circuit including a parasitic semiconductor device between the output terminal of the driving unit and the input terminal of the latch unit.

The simulation circuit is tested to determine the resistance value of the equivalent resistor.

In some embodiments, the test module 802 is specifically used to:

receiving a first file, where the first file includes parasitic parameter information and connection information of the parasitic semiconductor device.

The simulation circuit is established based on the circuit structure information and the first file.

In some embodiments, the transmission gate is included in the simulation circuit.

In some embodiments, the test module 802 is specifically used to:

applying a working voltage is at the output terminal of the driving unit, and measuring a working current at the input terminal of the latching unit to determine the resistance value of the equivalent resistor.

In some embodiments, the judgment module 803 is specifically used for:

determining a resistance threshold corresponding to the drive unit.

It is judged whether the resistance value of the equivalent resistor is greater than the resistance threshold value, and if the resistance value of the equivalent resistor is greater than the resistance threshold value, it is determined that the latch is in a metastable state.

In some embodiments, the judgment module 803 is specifically used for:

receiving a second file, where the second file includes resistance thresholds corresponding to the drive units.

In some embodiments, the driving unit includes an inverter, the inverter includes an NMOS transistor and a PMOS transistor, and an output terminal of the driving unit is a drain port that is commonly connected to the NMOS transistor and the PMOS transistor.

In some embodiments, the extraction module 801 is also used to:

receiving a third file, where the third file includes circuit structure information of a plurality of latches to be tested; and extracting the circuit structure information of each latch to be tested in the third file.

It should be noted that, for the specific content executed by the extracting module 801, the testing module 802, and the determining module 803 in the embodiment of the present disclosure, reference may be made to the relevant content in the embodiments shown in FIG. 1 to FIG. 7, which will not be repeated here.

Further, based on the content described in the foregoing embodiments, the embodiments of the present disclosure further provide an electronic device, the electronic device includes at least one processor and a memory; wherein, the memory stores computer execution instructions; the above-mentioned at least one processor, and the computer-executed instructions stored in the memory are executed to implement the various steps in the latch performance detection method described in the foregoing embodiment, which will not be repeated in this embodiment.

Figure 9:
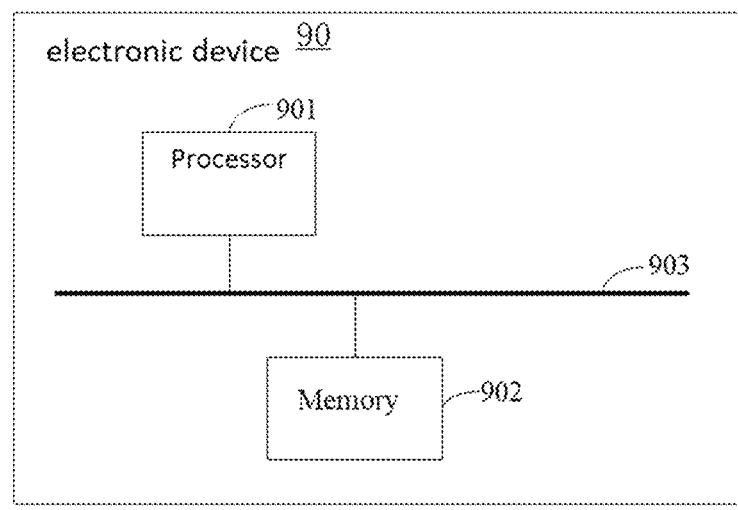
FIG. 9 is a schematic block diagram of an electronic device according to an embodiment of the present disclosure.

For a better understanding of the embodiments of the present disclosure, refer to FIG. 9, which is a schematic block diagram of an electronic device according to an embodiment of the present disclosure.

As shown in FIG. 9, the electronic device 90 in this embodiment includes: a processor 901 and a memory 902; wherein:

the memory 902 stores computer-executed instructions; and the processor 901 is configured to execute the computer-executed instructions stored in the memory, so as to implement each step in the latch performance detection method described in the foregoing embodiments. For details, reference may be made to the relevant descriptions in the foregoing method embodiments.

Optionally, the memory 902 may be independent or integrated with the processor 901.

When the memory 902 is provided independently, the device further includes a bus 903 for connecting the memory 902 and the processor 901.

In the several embodiments provided in the present disclosure, it should be understood that the disclosed apparatus and method may be implemented in other methods. For example, the device embodiments described above are only illustrative. For example, the division of the modules is only a logical function division. In actual implementation, there may be other division methods. For example, multiple modules may be combined or integrated to another system, or some features can be ignored, or not implemented. On the other hand, the shown or discussed mutual coupling or direct coupling or communication connection may be through some interfaces, indirect coupling or communication connection of devices or modules, and may be in electrical, mechanical or other forms.

The modules described as separate components may or may not be physically separated, and the components shown as modules may or may not be physical units, that is, may be located in one place, or may be distributed to multiple network units. Some or all of the modules may be selected according to actual needs to achieve the purpose of the solution in this embodiment.

In addition, each functional module in each embodiment of the present disclosure may be integrated in one processing unit, or each module may exist physically alone, or two or more modules may be integrated in one unit. The above-mentioned unit of module integration can be implemented in the form of hardware, or can be implemented in the form of hardware plus software functional units.

The above-mentioned integrated modules implemented in the form of software functional modules can be stored in a computer-readable storage medium. The above-mentioned software function modules are stored in a storage medium, and include several instructions to enable a computer device (which may be a personal computer, a server, or a network device, etc.) or a processor to execute the various embodiments of the present disclosure. part of the method.

It should be understood that the above processor may be a central processing unit (CPU), and may also be other general-purpose processors, digital signal processors (DSP), application-specific integrated circuits (ASIC) and so on. A general purpose processor may be a microprocessor or the processor may be any conventional processor or the like. The steps in combination with the disclosed method can be directly embodied as executed by a hardware processor, or executed by a combination of hardware and software modules in the processor.

The memory may include high-speed RAM memory, and may also include non-volatile storage NVM, such as at least one magnetic disk memory, and may also be a U disk, a removable hard disk, a read-only memory, a magnetic disk or an optical disk, and the like.

The bus may be an Industry Standard Architecture (ISA) bus, a Peripheral Component (PCI) bus, or an Extended Industry Standard Architecture (EISA) bus, or the like. The bus can be divided into address bus, data bus, control bus and so on. For ease of representation, the buses in the drawings of the present disclosure are not limited to only one bus or one type of bus.

The above storage medium can be implemented by any type of volatile or non-volatile storage devices or combinations thereof, such as Static Random Access Memory (SRAM), Electrically Erasable Programmable Read-Only Memory (EEPROM), Erasable Except Programmable Read Only Memory (EPROM), Programmable Read Only Memory (PROM), Read Only Memory (ROM), Magnetic Memory, Flash Memory, Magnetic Disk or Optical Disk. A storage medium can be any available medium that can be accessed by a general purpose or special purpose computer.

An exemplary storage medium is coupled to the processor, such that the processor can read information from, and write information to, the storage medium. Of course, the storage medium can also be an integral part of the processor. The processor and the storage medium may be located in application specific integrated circuits (ASIC for short). Of course, the processor and the storage medium may also exist in the electronic device or the host device as discrete components.

Those of ordinary skill in the art can understand that all or part of the steps of implementing the above method embodiments may be completed by program instructions related to hardware. The aforementioned program can be stored in a computer-readable storage medium. When the program is executed, the steps including the above method embodiments are executed; and the foregoing storage medium includes: ROM, RAM, magnetic disk or optical disk and other media that can store program codes.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: The technical solutions described in the foregoing embodiments can still be modified, or some or all of the technical features thereof can be equivalently replaced; and these modifications or replacements do not make the essence of the corresponding technical solutions deviate from the technical scope of the embodiments of the present disclosure.

The invention claimed is:

1. A method of detecting a latch performance, which is implemented through a simulation software, comprising:
   extracting circuit structure information of a latch which is to be tested, wherein the latch comprises a transmission gate and a latch unit, wherein an output terminal of the transmission gate is coupled to an input terminal of the latch unit, and wherein an input terminal of the transmission gate coupled to an output terminal of a drive unit which is corresponding to the latch;
   determining a resistance value of an equivalent resistor of the latch unit-based on the circuit structure information, wherein a first terminal of the equivalent resistor is an output terminal of the drive unit, and wherein a second terminal of the equivalent resistor is the input terminal of the latch unit; and
   determining a latching performance of the latch based on the resistance value of the equivalent resistor, and which comprises:
   determining a resistance threshold value of the the drive unit; judging whether the resistance value of the equivalent resistor is greater than the resistance threshold value, wherein if the resistance value of the equivalent resistor is greater than the resistance threshold value, it is determined that the latch is in a metastable state; and
   in response to determining that the latch is in a metastable state, recording and reporting the metastable latch to the simulation software to improve it.

2. The method according to claim 1, wherein determining the resistance value of the equivalent resistor of the latch based on the circuit structure information comprises:
   establishing a simulation circuit based on the circuit structure information, wherein the simulation circuit comprises parasitic semiconductor devices between the output terminal of the drive unit and the input terminal of the latch unit; and
   testing the simulation circuit to determine the resistance value of the equivalent resistor.

3. The method according to claim 2, wherein establishing the simulation circuit based on the circuit structure information comprises:
   receiving a first file, where the first file includes parasitic parameter information and connection information of the parasitic semiconductor devices; and
   establishing the simulation circuit based on the circuit structure information and the first file.

4. The method according to claim 2, wherein the transmission gate is included in the simulation circuit.

5. The method according to claim 4, wherein the simulation circuit is tested to determine the resistance value of the equivalent resistor comprises:
   applying a working voltage at the output terminal of the drive unit, and wherein a working current is measured at the input terminal of the latch unit to determine the resistance value of the equivalent resistor.

6. The method according to claim 1, wherein determining the resistance threshold value of the drive unit comprises:
   receiving a second file, where the second file includes the resistance threshold value of the drive unit.

7. The method according to claim 1, wherein the drive unit includes an inverter, wherein the inverter includes an NMOS transistor and a PMOS transistor and wherein the output terminal of the drive unit is connected to drain terminals of the NMOS transistor and the PMOS transistor.

8. The method according to claim 1, wherein, before extracting the circuit structure information of the latch to be tested, the method further comprising:
   receiving a third file, wherein the third file includes circuit structure information of a plurality of latches to be tested;
   wherein extracting circuit structure information of the latch includes:
   extracting the circuit structure information of all the plurality of latches to be tested from the third file.

9. An apparatus for detecting a latch performance, comprising:
   an extraction module, wherein the extraction module extracts circuit structure information of a latch to be tested, wherein the latch comprises a transmission gate and a latch unit, wherein an output terminal of the transmission gate is coupled to an input terminal of the latch unit, wherein an input terminal of the transmission gate is coupled to an output terminal of a drive unit corresponding to the latch;

a test module, configured to determine a resistance value of an equivalent resistor of the latch based on the circuit structure information, wherein a first terminal of the equivalent resistor is the output terminal of the drive unit, and wherein a second terminal of the equivalent resistor is the input terminal of the latch unit; and a judgment module, configured to determine the performance of the latch device based on a resistance value of the equivalent resistor, and configured to determine a resistance threshold value of the drive unit; and judging whether the resistance value of the equivalent resistor is greater than the resistance threshold value, wherein if the resistance value of the equivalent resistor is greater than the resistance threshold value, it is determined that the latch is in a metastable state; and a record module, configured to, in response to determining that the latch is in a metastable state, record and report the metastable latch to the simulation software to improve it.

10. The apparatus according to claim 9, wherein the test module is used for:

establishing an simulation circuit based on the circuit structure information, wherein the simulation circuit comprises parasitic semiconductor devices between the output terminal of the driving unit and the input terminal of the latch unit;

wherein the simulation circuit is tested to determine the resistance value of the equivalent resistor.

11. The apparatus according to claim 10, wherein the test module is used for:

receiving a first file, where the first file comprise parasitic parameter information and connection information of the parasitic semiconductor devices; and wherein the simulation circuit is established based on the circuit structure information and the first file.

12. The apparatus according to claim 10, wherein the transmission gate is included in the simulation circuit.

13. The apparatus according to claim 12, wherein the test module is used for:

applying a working voltage at the output terminal of the driving unit, and measuring a working current at the input terminal of the latch unit to determine the resistance value of the equivalent resistor.

14. The apparatus according to claim 9, wherein the judgment module is further configured to:

receiving a second file, where the second file comprises the resistance threshold value of the drive unit.

15. The apparatus according to claim 9, wherein the drive unit comprises an inverter, wherein the inverter comprises an NMOS transistor and a PMOS transistor, wherein an output terminal of the drive unit is connected to both drain terminals of the NMOS transistor and the PMOS transistor.

16. The apparatus of claim 9, wherein the extraction module is further configured to:

receiving a third file, where the third file includes circuit structure information of a plurality of latches to be tested; and extracting the circuit structure information of all the plurality of latches to be tested from the third file.

17. An electronic device comprising: at least one processor and one memory; wherein the memory stores computer-executable instructions; and wherein the at least one processor executes the computer-executable instructions stored in the memory, so that the at least one processor executes the method of detecting the latch performance according to claim 1.

* * * * *